United States Patent
Staszewski et al.

(10) Patent No.: US 9,337,847 B2
(45) Date of Patent: May 10, 2016

(54) OSCILLATOR

(71) Applicant: Huawei Technologies Co., Ltd., Shenzhen (CN)

(72) Inventors: Robert Bogdan Staszewski, Delft (NL); Masoud Babaie, Delft (NL); Zhuobiao He, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/327,781

(22) Filed: Jul. 10, 2014

(65) Prior Publication Data

US 2014/0320215 A1 Oct. 30, 2014

Related U.S. Application Data

(63) Continuation of application No. PCT/EP2013/053108, filed on Feb. 15, 2013.

(51) Int. Cl.
*H03B 5/08* (2006.01)
*H03L 7/06* (2006.01)
*H03B 5/12* (2006.01)
*H03H 11/04* (2006.01)

(52) U.S. Cl.
CPC *H03L 7/06* (2013.01); *H03B 5/124* (2013.01); *H03B 5/1215* (2013.01); *H03B 5/1228* (2013.01); *H03B 5/1265* (2013.01); *H03B 5/1296* (2013.01); *H03H 11/0405* (2013.01); *H03B 2200/007* (2013.01); *H03B 2200/0036* (2013.01); *H03B 2200/0048* (2013.01); *H03B 2200/0062* (2013.01); *H03B 2200/0082* (2013.01)

(58) Field of Classification Search
CPC .............................. H03B 5/124; H03B 5/1228
USPC .................. 331/167, 117 R, 117 FE, 179
See application file for complete search history.

(56) References Cited

U.S. PATENT DOCUMENTS

| | | | |
|---|---|---|---|
| 6,147,567 A | 11/2000 | Welland et al. | |
| 7,230,504 B1 * | 6/2007 | Marques | H03B 5/1228 331/117 FE |
| 7,342,464 B2 * | 3/2008 | Hino | H03C 3/227 331/108 C |
| 8,159,308 B1 | 4/2012 | Sutardja | |
| 2005/0285687 A1 | 12/2005 | Zhang et al. | |
| 2008/0074199 A1 | 3/2008 | Jang et al. | |

(Continued)

FOREIGN PATENT DOCUMENTS

CN 102870323 A 1/2013

OTHER PUBLICATIONS

Foreign Communication From a Counterpart Application, PCT Application No. PCT/EP2013/053108, International Search Report dated Jan. 30, 2014, 7 pages.

(Continued)

*Primary Examiner* — Arnold Kinkead
(74) *Attorney, Agent, or Firm* — Conley Rose, P.C.; Grant Rodolph

(57) ABSTRACT

An oscillator used in RF system. The oscillator includes a pair of transistors to which source terminals are interconnected and to which drain and gate terminals are coupled by a positive feedback loop comprising an oscillator tank, wherein the source terminals of the transistors are connected to a current source configured to control physical parameters of the oscillator.

12 Claims, 10 Drawing Sheets

(56) References Cited

U.S. PATENT DOCUMENTS

2009/0189704 A1* 7/2009 Li .................. H03B 5/1228
 331/117 R
2013/0162361 A1 6/2013 Visweswaran et al.

OTHER PUBLICATIONS

Foreign Communication From a Counterpart Application, PCT Application No. PCT/EP2013/053108, Written Opinion dated Jan. 30, 2014, 12 pages.

Hegazi, E., et al., "A Filtering Technique to Lower LC Oscillator Phase Noise," IEEE Journal of Solid-State Circuits, vol. 36, No. 12, Dec. 1, 2001, pp. 1921-1930.

Hajimiri, A., et al., "Design Issues in CMOS Differential LC Oscillators," IEEE Journal of Solid-State Circuits, vol. 34, No. 5, May 1, 1999, pp. 717-724.

Gagliolo, S., et al., "Phase Noise Performances of a Cross-Coupled CMOS VCO with Resistor Tail Biasing," Biophysical and Electronic Engineering Department, Sep. 4-7, 2005, pp. 149-153.

Hegazi, E., et al., "A Filtering Technique to Lower Oscillator Phase Noise," ISSCC, Session 23, Analog Techniques, 23.4, Feb. 7, 2001, 3 pages.

Lee, T., et al., "Oscillator Phase Noise: A Tutorial," IEEE Journal of Solid-State Circuits, vol. 35, No. 3, Mar. 2000, pp. 326-336.

Visweswaran, A., et al., "A Clip-and-Restore Technique for Phase Desensitization in a 1.2V 65nm CMOS Oscillator for Cellular Mobile and Base Stations," ISSCC, Session 20, RF Frequency Generation, 20.5, Feb. 22, 2012, pp. 350-352.

Mazzanti, A., et al., "Class-C Harmonic CMOS VCOs, With a General Result on Phase Noise," IEEE Journal of Solid-State Circuits, vol. 43, No. 12, Dec. 2008, pp. 2716-2729.

"Part 11: Wireless LAN Medium Access Control (MAC) and Physical Layer (PHY) Specifications, Amendment 4: Further Higher Data Rate Extension in the 2.4 GHz Band," IEEE Std 802.11g, Jun. 27, 2003, 78 pages.

* cited by examiner

OSCILLATOR

CROSS-REFERENCE TO RELATED APPLICATIONS

This application is a continuation of International Application No. PCT/EP2013/053108, filed on Feb. 15, 2013, which is hereby incorporated by reference in its entirety.

TECHNICAL FIELD

The present invention relates to an oscillator, in particular to a modified clip and restore oscillator.

BACKGROUND

Transceiver architectures rely on frequency conversion using local oscillator to generate either radio frequency (RF) or intermediate frequency (IF) local signals to up-convert baseband signals to RF signals or vice versa. So, the oscillator is one of the most important components in each wireless system. The local oscillator performances affect wireless systems as described in the following.

Phase noise is one of the most critical impairments of radio systems, as it corrupts the information carried in the phase of the carrier due to its non-ideality. There are two different types of corruptions that phase noise can make in the systems. One is from in-band, i.e. modulated signal band phase noise, which directly affects down converted or up converted signals. The amount of in-band phase noise, other than the one that is very close to the carrier, which is slow varying enough for the data to be affected, can be represented as a phase error or error vector magnitude (EVM).

Another key aspect of phase noise impact can be explained with an interferer, which is often called a blocker, is shown in FIG. 1. A mixer 100 is mixing a radio frequency signal RF comprising a desired signal 102 and an interfering signal 104 with a local oscillator signal LO having a local oscillator frequency spectrum 110. The mixer 100 produces an IF signal which frequency spectrum is obtained by a superposition of the local oscillator frequency spectrum 110 mixed by the desired signal 102 and the local oscillator frequency spectrum 110 mixed by the interfering signal 104. When a blocker gets up or down converted, the LO's phase noise will override its phase noise onto the blocker and parts of the phase noise will stay on top of the signal band. These types of non-ideal phase noise can impact any type of radio system such as wideband code division multiple access (W-CDMA) and global system for mobile communications (GSM). The destructive effect of phase noise can be best seen in the front end of a superheterodyne receiver.

Since orthogonal frequency division modulation (OFDM) signals transmit multi-carriers in the frequency domain, multi-carriers with the same phase noise on each carrier can be analyzed as one single-carrier with the same phase noise. However, the far-out phase noise can cause inter symbol interference (ISI), which means there is going to be a system requirement on phase noise for this system as well. Long-term Evolution (LTE) and 802.11g systems use OFDM techniques.

On the other hand, the frequency spectrum is a valuable asset in the wireless communications. The number of wireless users demands more efficient usage of frequency resources. The communication transceivers rely on frequency conversion using local oscillator and therefore the spectral purity of the oscillators in both the receiver and transmitter is one of the factors limiting the performance and maximum number of available channels and users.

Conventionally, cross coupled negative, i.e. −gm, oscillators usually form the basis for low noise high performance oscillator designs. Moreover, tail-current shaping, operation in class-C mode and higher oscillators may also be deployed. However, the known oscillators suffer from the fact that most circuit noise converts to phase noise. This limits the lowest phase noise achievable. We review the status of the latest prior technologies.

FIG. 2A shows a schematic diagram of a clip and restore (C&R) oscillator (DCO) or voltage controlled oscillator (VCO) as described by A. Visweswaran, R. B. Staszewski, J. R. Long: "A clip and restore technique for phase desensitization in 1.2 V 65 nm CMOS oscillator for cellular mobile and base stations". Positive feedback is realized between the drain and gate terminals of transistors M1 and M2 using 1:2 step-up transformers T1 and T2. The transistors M1 and M2 are realized as thick oxide devices withstanding to large swing. Large swing decreases rise and fall time of output oscillation voltage and ensures hard clipping at output. Separate transformers T1 and T2 provide common mode rejection, adequate coupling, that means not too week, and are designed to control impedance transformation at their interface. The voltage gain is realized by winding step-up and impedance mismatch between drain and gate by the transformer turns ratios and coupling factor. As signal amplitude 201 at gate decreases, the transistors M1 and M2 transition quickly from saturation 206 to triode 212, causing output signal 203 to clip as can be seen from FIG. 2B. The transition regions 204 are small. The bias voltage (VB) is varied to adjust the onset of clipping. The fundamental tone excites the secondary winding of T1, while harmonics are shunted to ground through capacitance CF2. The transistor gates are driven by the second transformer T2, which steps up the filtered waveform for peak-to-peak swing more than the traditional oscillators. This strong overdrive ensures hard clipping at the transistor output. According to the linear time-variant phase noise model, the impulse sensitivity function quantifies phase noise sensitivity across one period of oscillation. Note that drain voltage 203 is clipped and the ISF value is zero during the clipping time 202. Hence, noise injected by the passive and active devices as well as power supply does not perturb the oscillator zero-crossings or phase in the clipping time. Capacitance CF1 improves frequency pushing and decreases sensitivity of output frequency to P-type metal-oxide-semiconductor logic (PMOS) parasitic. Switched capacitor circuit CX1 is used for course tuning the tank while switched capacitor circuit CX2 is used for fine tuning the tank. Node N is used for adjusting the drain voltage clipping and current consumption of the oscillator.

The document of T. Lee, A. Hajimiri: "Oscillator Phase Noise: A tutorial," in IEEE J. Solid State Circuits, Vol. 35, no. 2, pp. 326-336, March 2000 describes that signal amplitude and resonator quality factor should be maximized to get a better phase noise performance in the 20 dB/Dec section. The Impulse Sensitivity Function (ISF) specifies the contribution of the circuit noise components to the phase noise in terms of waveform properties of the oscillator. The direct current (DC) value of the effective ISF should be made as close to zero as possible to suppress the up-conversion of 1/f noise.

The document of Mazzanti and P. Andreani: "Class C Harmonic CMOS VCOs, With General Result on Phase Noise" in IEEE J. Solid State Circuits, vol. 43, NO. 12, pp. 2716-2729, December 2008 describes that a large tail capacitance at the common source node of the differential pair, together with a bias network to prevent the transistors from working in the deep triode region, allows at the same time a high conversion efficiency of the DC bias current in to the fundamental current component of gm device current and a minimum generation of the effective noise of the tank, thus maximizing the figure of merit performance.

The document of E. Hegazi, H. Sjoland, A. Abidi: "A Filtering Technique to lower Oscillator Phase Noise," in ISSCC Dig. Tech. papers, February 2001 describes a capacitor and an inductor, in series with a current source forming a low pass filter which shunts noise at 2f from the current source to ground. The additional resonator also provides a high impedance path between the tank and ground. Consequently, the structure doesn't degrade Q of the tank. It can improve phase noise and figure of merit (FoM) of the oscillator.

Base station receiver (RX) oscillator phase noise requirements between 600 kilohertz (KHz) and 3 MHz are extremely difficult to satisfy using a fully monolithic VCO or DCO fabricated in bulk Complementary metal-oxide-semiconductor (CMOS) technology. The GSM -900-BTS and the DCS-1800-BTS RX specifications at 800 kHz of −147 dBc/Hz and −138Bc/Hz, respectively, are considered the most difficult phase noise specifications to meet. The following equation (1) gives the phase noise spectrum of an arbitrary oscillator in the $1/f^2$ region of the phase noise spectrum.

$$L(\Delta\omega) = 10\ \log_{10}\left(\frac{\sum_i \Gamma_{rms}^2(i_{n,i}^2/\Delta f)}{2C^2 A^2(\Delta\omega)^2}\right), \quad (1)$$

where $i_n^2/\Delta f$ is the equivalent noise current mean square density per bandwidth, A is the voltage amplitude of oscillation voltage, $\Gamma_{rms}$ is the root mean square (rms) value of the ISF for the noise current source, C is the tuning capacitance of the resonator tank, $\omega_0$ is carrier frequency and ($\Delta\omega$) is the frequency offset from the carrier.

$\Gamma_{rms}$, the rms value of the impulse sensitivity function, is a dimensionless, frequency and amplitude independent periodic function with a period of $2\pi$ which describes how much phase shift results from applying a unit impulse noise at the certain point of oscillation voltage. This parameter is constant for a given oscillator architecture and it is independent from the technology.

Equation (1) illustrates that phase noise improves as both the carrier power and equivalent quality factor Q increase at a given frequency offset. But unfortunately, the oscillation amplitude swing is limited to twice of the voltage source (VDD) in the traditional oscillator structures, and VDD scales down in the advanced CMOS technology. Consequently, the amplitude of oscillation decreases and degrades the phase noise performance. The quality factor of the tank is determined by the quality factor of the inductor of the oscillator. The quality factor will be improved when reducing the DC resistance, skin effect and substrate loss of the inductor. In general, the quality factor of the inductor is limited to 15-30 due to limited width and thickness of the metal line and low resistivity material of the substrate. The maximum allowable width and conductivity of the metal improves a little in newer CMOS technology, but on the other hand the inductor will be closer to lossy substrate and it can reduce the quality factor of the inductor. Consequently, no significant phase noise improvement can be seen in newer CMOS technology.

SUMMARY

It is the object of the invention to provide an oscillator of improved phase noise performance.

This object is achieved by the features of the independent claims. Further implementation forms are apparent from the dependent claims, the description and the figures.

The invention is based on the finding that an oscillator of the clip-and-restore structure can be improved with respect to phase noise performance by adding a tail current to achieve better control of the clipping duration, oscillation amplitude and current consumption, shorter rise and fall time and by choosing proper capacitance values at various nodes of the oscillator in order to maximize the equivalent quality factor of the tank. Consequently, better phase noise performance and reliability of the oscillator can be achieved.

In order to describe the invention in detail, the following terms, abbreviations and notations will be used:
RF: radio frequency,
IF: intermediate frequency,
EVM: error vector magnitude,
RF: Radio Frequency,
LO: Local Oscillator,
BB: Baseband,
BW: Bandwidth,
LPF: Low-Pass Filter,
BPF: Band-Pass Filter,
ISF: Impulse Sensitivity Function,
VCO: Voltage Controlled Oscillator,
DCO: Oscillator,
W-CDMA: wideband code division multiple access,
GSM: global system for mobile communications,
ISI: Inter Symbol Interference,
LTE: Long Term Evolution,
802.11g: amendment to the IEEE 802.11 (WiFi, wireless fidelity) specification,
OFDM: Orthogonal Frequency Division Multiplex,
C&R: clip and restore,
VB: Bias voltage.

According to a first aspect, the invention relates to an oscillator, comprising a pair of transistors which source terminals are interconnected and which drain and gate terminals are coupled by a positive feedback loop comprising an oscillator tank, wherein the source terminals of the transistors are connected to a current source configured to control physical parameters of the oscillator.

According to some implementation forms, the oscillator described herein can be a digital controlled oscillator.

The oscillator is able to meet aggressive phase noise specifications by using the current source for controlling physical parameters of the DCO. By increasing power consumption, the rate of improvement in phase noise versus power consumption reduces as the transistors get driven hard from saturation to triode. The oscillation amplitude is increased, however, transistor provides low impedance route between the ground and tank. Hence, it degrades the Q of the tank. Consequently, the phase noise improvement would be negligible. The current source controlling the physical parameters of the DCO can minimize the time that gm-device works in the triode region for a given oscillator current consumption. In a first possible implementation form of the oscillator according to the first aspect, the current source is configured to control at least one of the physical parameters of the digitally controlled oscillator: clipping duration at oscillation voltage around the oscillator tank, oscillation voltage amplitude for process variations and satisfying reliability issues due to time dependent dielectric breakdown, hot carrier degradation and drain bulk breakdown, current consumption to adjust power consumption of the oscillator based on phase noise requirement, rise and fall times of the oscillation voltage around the oscillator tank.

The oscillator tank resistive noise can't degrade the phase noise in the clipping section of the drain voltage, so, this structure is less sensitive to quality factor of the oscillator tank and the technology. The effective impulse sensitivity function of noise of the gm stage transistor is zero during the transistors off state and maximum current (hard clipping). Consequently, noise contribution of the gm transistor is much less than for other structures.

In a second possible implementation form of the oscillator according to the first aspect as such or according to the first implementation form of the first aspect, an oscillation frequency of the oscillator is determined by an input impedance of the oscillator tank comprising step-up transformers and tuning capacitances.

There is a certain voltage gain between the gate and the drain of the gm transistor resulting in a large voltage swing at the gate of the gm transistor. The phase noise is improved, in particular in 20 dB/dec region due to the larger amount of oscillator tank capacitance charge based on equation (1) as specified above. The 1/f3 phase noise corner moves to a lower frequency due to faster rise and fall time in this architecture. The oscillation amplitude is not limited by the supply voltage. The oscillator can be connected directly to a buffer or a divider due to the larger amplitude of oscillation.

In a third possible implementation form of the oscillator according to the first aspect as such or according to any of the preceding implementation forms of the first aspect, the current source is configured to adjust current consumption and amplitude of the oscillator.

Adjusting current consumption and amplitude of the DCO enforces drain voltage waveform clipping to reduce sensitivity of the oscillator phase noise to the circuit noise source such as thermal noise of MOS transistor and series resistance of the inductor.

In a fourth possible implementation form of the oscillator according to the first aspect as such or according to any of the preceding implementation forms of the first aspect, the current source comprises a metal-oxide-semiconductor field-effect transistor (MOSFET) transistor or a resistor or a combination of a resistor and an inductor.

A current source can be efficiently integrated on a chip when a MOSFET transistor or a resistor or a combination of a resistor and an inductor is used.

In a fifth possible implementation form of the oscillator according to any of the second to the fourth implementation forms of the first aspect, terminals of the step-up transformers are coupled via capacitances which are configured according to an optimization criterion with respect to a desired oscillator tank impedance, phase noise performance and reliability.

When configuring the capacitances according to that optimization criterion the desired oscillator tank impedance, the phase noise performance and the reliability of the DCO can be improved.

In a sixth possible implementation form of the oscillator according to any of the second to the fifth implementation forms of the first aspect, primary terminals of a first transformer are connected to drain terminals of the transistors and secondary terminals of the first transformer are connected to intermediate nodes which are common between the secondary terminals of the first transformer and primary terminals of a second transformer; primary terminals of the second transformer are connected to the intermediate nodes (IMA, IMB) and secondary terminals of the second transformer are connected to the gate terminals of the transistors; and a turns ratio of the first transformer is $1:n_1$ and a turns ratio of the second transformer is $1:n_2$.

There is a certain voltage gain between the drain and the intermediate node of the oscillator. It increases the voltage across the coarse tuning capacitors. Consequently, it improves the phase noise based on equation (1) specified above.

In a seventh possible implementation form of the oscillator according to the sixth implementation form of the first aspect, the primary terminals of the first transformer are coupled via a first capacitance to a reference voltage, the secondary terminals of the first transformer and the primary terminals of the second transformer are coupled via a second capacitance to the reference voltage and the secondary terminals of the second transformer are coupled via a third capacitance to the reference voltage.

So, the capacitances allow tuning of the oscillator. The third capacitance can be fixed for better phase noise performance or switched-capacitors for larger frequency tuning range, the second capacitance can provide the coarse tuning and the first capacitance can provide the fine tuning of the DCO.

In an eighth possible implementation form of the oscillator according to the seventh implementation form of the first aspect, an oscillation frequency of the oscillator is determined as:

$$\omega \approx \frac{1}{\sqrt{\left(\frac{L_{p1}L_{p2}}{n_1^2 L_{p1} + L_{p2}}\right)(C_1 + C_2 n_1^2 + C_3 n_1^2 n_2^2)}}$$

where $\omega$ denotes the oscillation frequency of the oscillator, $C_1$ denotes the first capacitance, $C_2$ denotes the second capacitance, $C_3$ denotes the third capacitance, $n_1$ denotes the turns ratio of the first transformer, $n_2$ denotes the turns ratio of the second transformer, $L_{p1}$ denotes a primary inductance of the first transformer and $L_{p2}$ denotes a primary inductance of the second transformer.

The oscillation frequency of the DCO can be freely adjusted by the three capacitances and the other design parameters of the oscillator tank.

In a ninth possible implementation form of the oscillator according to the sixth or according to the seventh implementation form of the first aspect, the third capacitance is set to a fixed value designed for ultra-low phase noise performance of the oscillator, the third capacitance satisfying the following relation:

$$\frac{C_3 n_1^2 n_2^2}{C_1 + C_2 n_1^2 + C_3 n_1^2 n_2^2} > 0.2,$$

where $C_1$ denotes the first capacitance, $C_2$ denotes the second capacitance, $C_3$ denotes the third capacitance, $n_1$ denotes the turns ratio of the first transformer and $n_2$ denotes the turns ratio of the second transformer.

The proper portion between the coarse capacitance $C_2$ and the fine capacitance $C_1$ improves the equivalent quality factor of the tank.

When increasing the third capacitance for a fixed fundamental frequency a larger oscillator tank voltage gain, a higher gate swing, a shorter oscillation voltage rise and fall time and a better phase noise performance is obtained. However, it is necessary to use fixed capacitors for the third capacitance due to high sensitivity of the phase noise to parasitic inductance and low-Q capacitance at the gate node of the oscillator. So, when fixing the third capacitance C3, the oscillator can be applied for ultra-low phase noise RF applications, i.e. for phase noise in the range better than −153 dBc/Hz at 3 MHz offset frequency for a 915 MHz carrier.

In a tenth possible implementation form of the oscillator according to any of the seventh to the ninth implementation forms of the first aspect, the oscillator tank exhibits three resonance frequencies from which the bigger one is undesired, a first resonance frequency determining an oscillation frequency of the oscillator and a second resonance frequency should be two times the fundamental resonance frequency to flatten more the clipping area; wherein the oscillator tank is configured to damp the undesired oscillation frequency at the third resonance frequency.

In an eleventh possible implementation form of the oscillator according to the tenth implementation form of the first aspect, the oscillator tank is configured to neutralize the undesired oscillation frequency by determining the first capacitance satisfying the following relation:

$$\frac{C_1}{C_1 + C_2 n_1^2 + C_3 n_1^2 n_2^2} > 0.2,$$

where $C_1$ denotes the first capacitance, $C_2$ denotes the second capacitance, $C_3$ denotes the third capacitance, $n_1$ denotes the turns ratio of the first transformers (T1) and $n_2$ denotes the turns ratio of the second transformer.

For a fixed oscillation frequency, decreasing the first capacitance makes the third resonance frequency of the oscillator tank to be the dominant pole, thus seeing an undesired oscillation. When the first capacitance satisfies the above relation, the undesired oscillation can be efficiently neutralized.

In a twelfth possible implementation form of the oscillator according to the tenth or according to the eleventh implementation form of the first aspect, the third capacitance is predetermined and the first and second capacitances are configured to provide an equivalent quality factor of the oscillator tank at the fundamental resonance frequency according to the relation:

$$Q_{osc1} = \frac{(L_s C_2 + L_p C_1)}{\left(\frac{L_p C_1}{Q_p} + \frac{L_s C_2}{Q_s}\right)},$$

where $C_1$ denotes the first capacitance, $C_2$ denotes the second capacitance, $Q_{osc1}$ denotes the equivalent quality factor of the oscillator tank at the fundamental resonance frequency, $Q_p$ denotes a quality factor of primary windings of the first transformer, $Q_s$ denotes a quality factor of secondary windings of the first transformer, $L_p$ denotes an inductance of the primary windings of the first transformer and $L_s$ denotes an inductance of the secondary windings of the first transformer.

By applying that above relation and considering the Q factor of primary and secondary windings of the transformers, the equivalent quality factor of the oscillator tank can be improved by adjusting the first and second capacitance.

In a thirteenth possible implementation form of the oscillator according to any of the seventh to the twelfth implementation forms of the first aspect, the oscillator tank is configured to provide a peak position in the oscillator tank common mode input impedance near the second harmonic of the fundamental oscillation frequency by adjusting the ratio of the second capacitance to the first capacitance.

A peak position of the oscillator tank common mode input impedance at near the second harmonic of fundamental frequency results in improved phase noise behavior of the oscillator.

In a fifteenth possible implementation form of the oscillator according to the first aspect as such or according to any of the preceding implementation forms of the first aspect, the transistors are MOSFET transistors, in particular CMOS transistors.

MOSFET transistors and CMOS transistors are standard transistors which can be efficiently integrated on a chip.

In a sixteenth possible implementation form of the oscillator according to any of the second to the fifteenth implementation forms of the first aspect, the transformers are configured to control impedance transformation at their terminals.

When the transformers control impedance transformation at their terminals, the physical parameters of the DCO can be adjusted.

In a seventeenth possible implementation form of the oscillator according to the first aspect as such or according to any of the preceding implementation forms of the first aspect, the current source is a tail current source.

According to a second aspect, the invention relates to an oscillator, comprising a first transistor and a second transistor connected by their source terminals to a drain terminal of a third transistor, the third transistor forming a current source, wherein a drain terminal of the first transistor is connected via a first switched capacitor circuit to a drain terminal of the second transistor; wherein the drain terminal of the first transistor is connected to a first terminal of a primary winding of a first transformer and the drain terminal of the second transistor is connected to a second terminal of the primary winding of the first transformer; wherein a first terminal of a second winding of the first transformer is connected to a first terminal of a primary winding of a second transformer and connected via a second switched capacitor circuit to a second terminal of the second winding of the first transformer, which second terminal of the second winding of the first transformer is connected to a second terminal of the primary winding of the second transformer; wherein a first terminal of a second winding of the second transformer is connected to a gate terminal of the first transistor and connected via a third capacitance circuit to a second terminal of the second winding of the second transformer which second terminal of the second winding of the second transformer is connected to a gate terminal of the second transistor.

This DCO architecture provides the following improvements over the conventional clip-and-restore oscillator faster transition between the cut-off and triode region; reduced 1/f3 phase noise corner; increased clipping or noise insensitive region; less quality factor degradation at edge of clipping region; high reliability of the gm transistor due to time dependent dielectric breakdown of gate oxide voltage; better common mode rejection and better immunity to common mode noise; better control on onset of clipping and current consumption; optimized performance for tuning capacitance; quality factor of the oscillator tank is maximized; improved phase noise without additional components, current consumption or area; undesired resonance frequency managed; proper impulse sensitive function achieved; optimum point of phase noise performance, voltage gain and tuning range.

According to a third aspect, the invention relates to a switched capacitor circuit for an oscillator according to the first aspect as such or according to any of the preceding implementation forms of the first aspect or according to the second aspect, the switched capacitor circuit comprising a plurality of parallel connected switched capacitor lines, each of the switched capacitor lines comprising: a first capacitor connected between an input terminal and a first node of the switched capacitor line; a second capacitor connected between an output terminal and a second node of the switched capacitor line; a first switch connected between the first node and the second node of the switched capacitor line; a second switch connected between the input terminal and the first node of the switched capacitor line; a third switch connected between the output terminal and the second node of the switched capacitor line; a fourth switch connected between the first node and a reference voltage; a fifth switch connected between the second node and the reference voltage.

Such a switched capacitor circuit works by moving charges into and out of capacitors when the switches are opened and closed. The switched capacitor circuit can efficiently be implemented by resistors, capacitors and CMOS transistor. This makes them much more suitable for use within integrated circuits, where accurately specified resistors and capacitors are not economical to construct.

In a first possible implementation form of the switched capacitor circuit according to the third aspect, the switches comprise transistors which gate terminals are controlled by a common switching signal from digital part.

According to a fourth aspect, the invention relates to a method for operating an oscillator comprising a pair of transistors which source terminals are interconnected and which drain and gate terminals are coupled by a positive feedback loop comprising an oscillator tank, the method comprising: shunting the source terminals of the transistors to a reference voltage by a current source; and controlling physical parameters of the oscillator by a current of the current source.

This method for operating an oscillator provides improved phase noise performance by using the current source for controlling physical parameters of the DCO. By increasing power consumption, the rate of improvement in phase noise versus power consumption reduces as the transistors get driven hard from saturation to triode. The oscillation amplitude is increased, however, transistor provides a low impedance route between the ground and tank. Hence, it degrades the Q of the tank. Consequently, the phase noise improvement would be negligible. The current source controlling the physical parameters of the DCO can minimize the time that gm-device works in the triode region for a given oscillator current consumption.

The methods, systems and devices described herein may be implemented as software in a Digital Signal Processor (DSP), in a micro-controller or in any other side-processor or as hardware circuit within an application specific integrated circuit (ASIC).

The invention can be implemented in digital electronic circuitry, or in computer hardware, firmware, software, or in combinations thereof, e.g. in available hardware of conventional mobile devices or in new hardware dedicated for processing the methods described herein.

BRIEF DESCRIPTION OF THE DRAWINGS

Further embodiments of the invention will be described with respect to the following figures, in which.

DETAILED DESCRIPTION OF EMBODIMENTS

Figure 1:
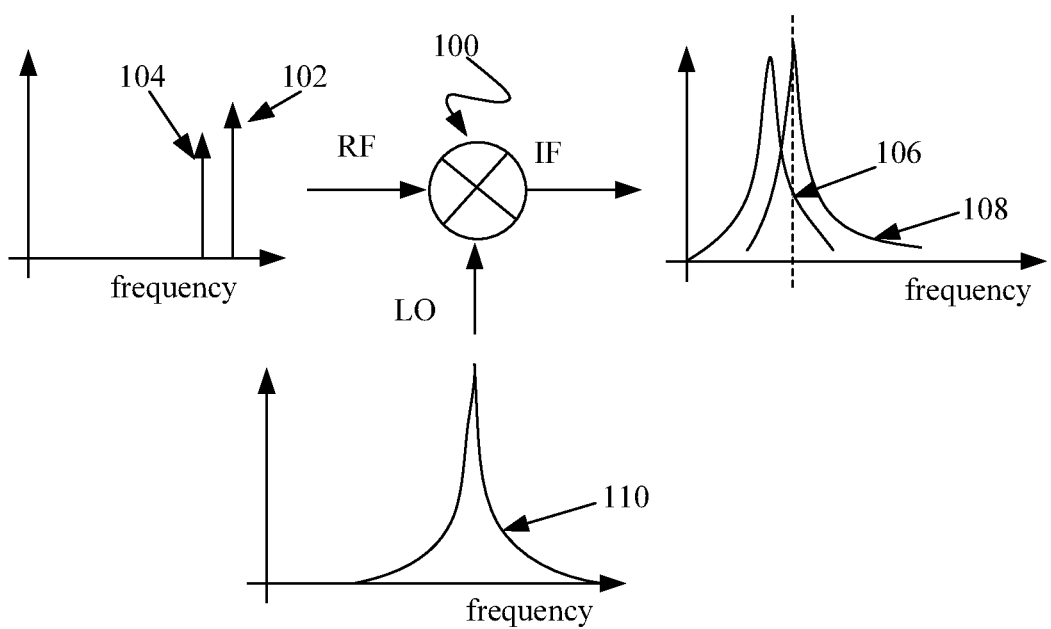
FIG. 1 shows a schematic diagram illustrating the effect of phase noise in the presence of adjacent strong interference.
Figure 2A:
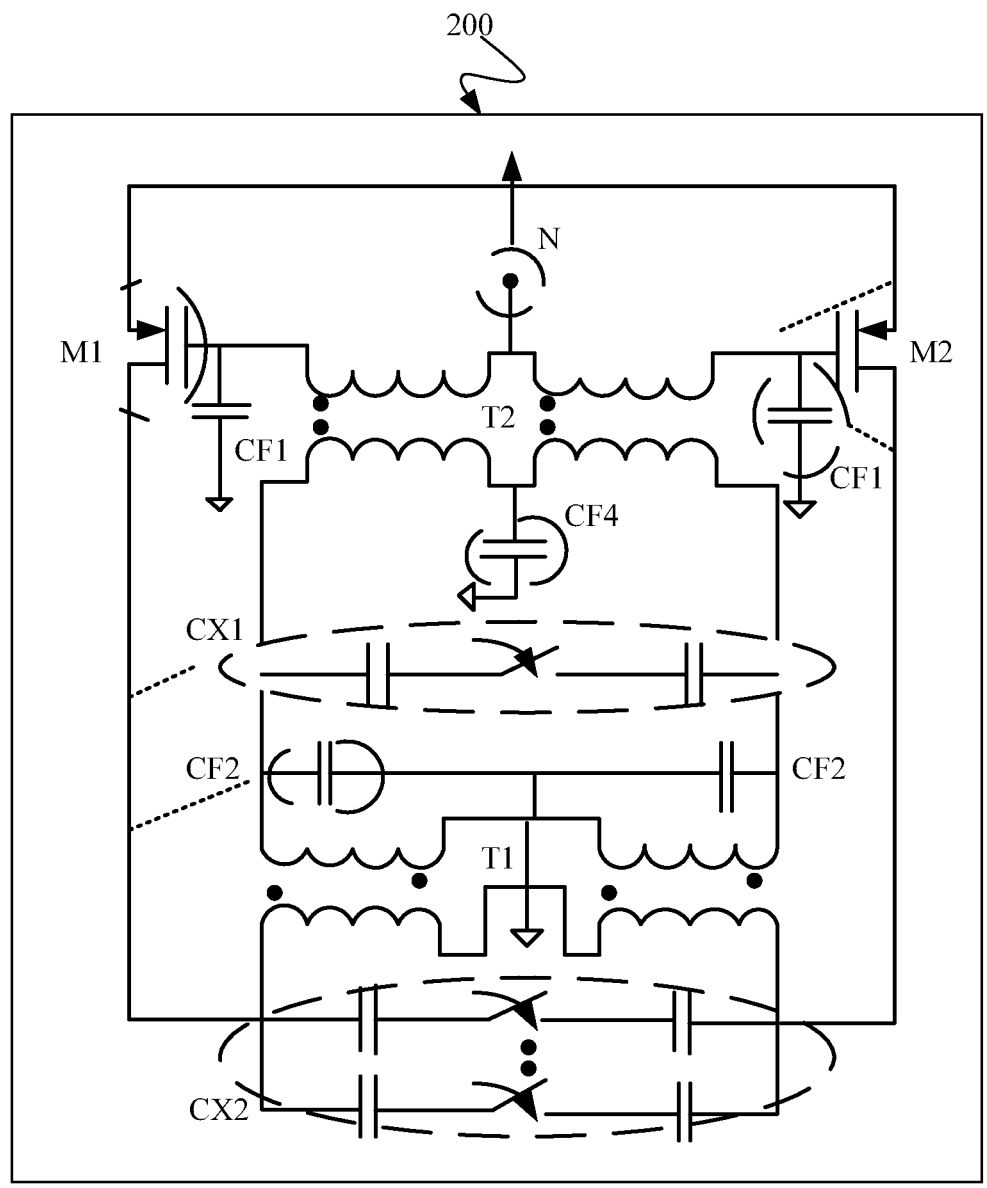
FIG. 2A shows a schematic diagram of an original clip-and-restore oscillator 200.
Figure 2B:
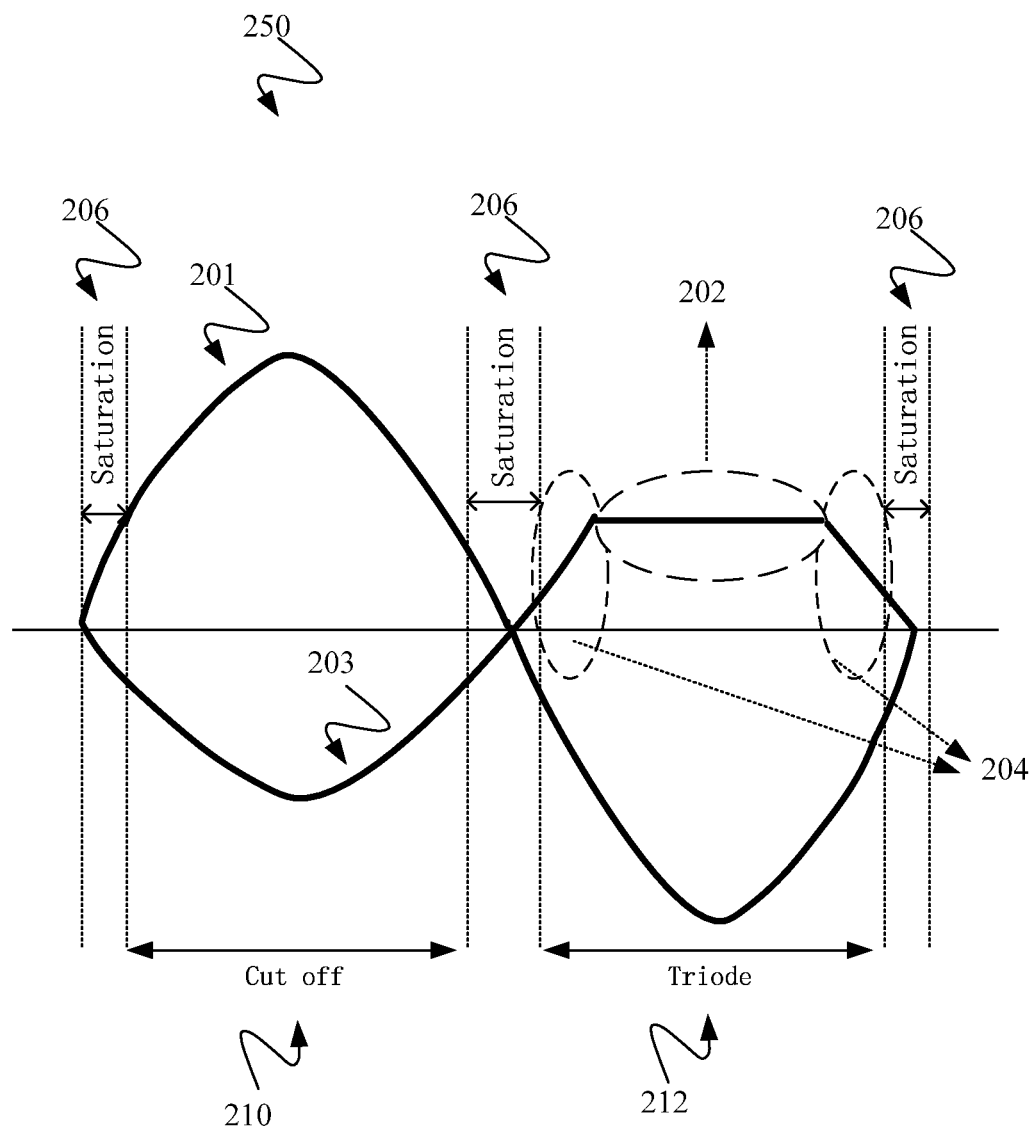
FIG. 2B shows a schematic diagram 250 illustrating drain voltage of the original clip-and-restore oscillator depicted in FIG. 2A.
Figure 3:
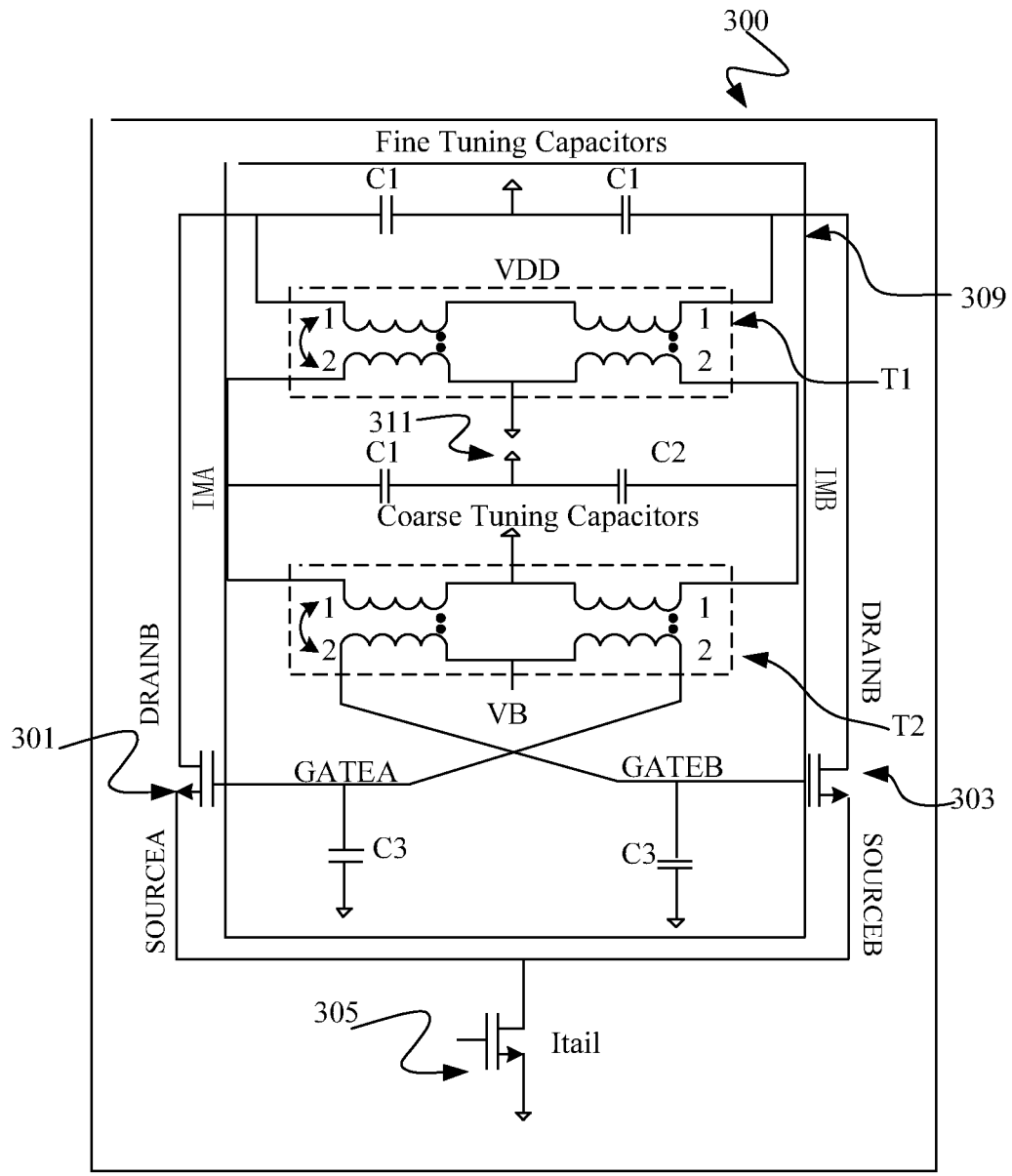
FIG. 3 shows a circuit diagram of an oscillator according to an implementation form.

FIG. 3 shows a circuit diagram of an oscillator 300 according to an implementation form.

The oscillator 300 comprises a pair of transistors 301, 303 which source terminals SOURCEA, SOURCEB are interconnected and which drain DRAINA, DRAINB and gate GATEA, GATEB terminals are coupled by a positive feedback loop comprising an oscillator tank 309. The source terminals SOURCEA, SOURCEB of the transistors 301, 303 are connected to a current source 305 configured to control physical parameters of the oscillator 300. The current source 305 provides a current or a tail current tail.

The current source 305 controls a clipping duration at oscillation voltage around the oscillator tank 309, an oscillation voltage amplitude for process variations and satisfying reliability issues due to time dependent dielectric breakdown, hot carrier degradation and drain bulk breakdown, a current consumption to adjust power consumption of the oscillator 300 based on phase noise requirement and/or rise and fall times of the oscillation voltage around the oscillator tank 309. An oscillation frequency of the oscillator 300 is determined by an input impedance of the oscillator tank 309 which comprises step-up transformers T1, T2 and tuning capacitances C1, C2, C3. The current source 305 adjusts current consumption and amplitude of the oscillator 300. In an implementation form, the current source 305 comprises a MOSFET transistor. In an implementation form, the current source 305 comprises a resistor. In an implementation form, the current source 305 comprises a combination of a resistor and an inductor. The terminals of the step-up transformers T1, T2 are coupled via the tuning capacitances C1, C2, C3 which are configured according to an optimization criterion with respect to a desired oscillator tank impedance, phase noise performance and reliability.

Primary terminals 1 of the first transformer T1 are connected to drain terminals DRAINA, DRAINB of the transistors 301, 303 and secondary terminals 2 of the first transformer T1 are connected to intermediate nodes IMA, IMB which are common between the secondary terminals 2 of the first transformer T1 and primary terminals 1 of the second transformer T2. Primary terminals 1 of the second transformer T2 are connected to the intermediate nodes IMA, IMB and secondary terminals 2 of the second transformer T2 are connected to the gate terminals GATEA, GATEB of the transistors 301, 303. A turns ratio of the first transformer T1, i.e. a turns ratio between the secondary to primary windings of the first transformer T1 is 1:$n_1$, where $n_1$ is an integer. A turns ratio of the second transformer T2, i.e. a turns ratio between the secondary to primary windings of the second transformer T2 is 1:$n_2$, where $n_2$ is an integer. The first transformer T1 is driven by voltage VDD at first winding 1 versus reference voltage 311 at second winding 2. The second transformer T2 is driven by voltage VB at second winding 2 versus reference voltage 311 at first winding 1.

The primary terminals 1 of the first transformer T1 are coupled via the first capacitance C1 to a reference voltage 311, e.g. ground (it can also be float, just connected to other C1 capacitor). The secondary terminals 2 of the first transformer T1 and the primary terminals 1 of the second transformer T2 are coupled via the second capacitance C2 to the reference voltage 311 ground (it can also be float, just connected to other C1 capacitor). The secondary terminals 2 of the second transformer T2 are coupled via the third capacitance C3 to the reference voltage 311 ground (it can also be float, just connected to other C1 capacitor).

In an implementation form, an oscillation frequency of the oscillator 300 is determined as:

$$\omega \approx \frac{1}{\sqrt{\left(\frac{L_{p1}L_{p2}}{n_1^2 L_{p1} + L_{p2}}\right)(C_1 + C_2 n_1^2 + C_3 n_1^2 n_2^2)}},$$

where $\omega$ denotes the oscillation frequency of the oscillator, $C_1$ denotes the first capacitance, $C_2$ denotes the second capacitance, $C_3$ denotes the third capacitance, $n_1$ denotes the turns ratio of the first transformer T1, $n_2$ denotes the turns ratio of the second transformer T2, $L_{p1}$ denotes a primary inductance of the first transformer T1 and $L_{p2}$ denotes a primary inductance of the second transformer T2.

In an implementation form, the third capacitance C3 is set to a fixed value designed for ultra-low phase noise performance of the oscillator 300 and the third C3 capacitances are adjusted for satisfying the following relation:

$$\frac{C_3 n_1^2 n_2^2}{C_1 + C_2 n_1^2 + C_3 n_1^2 n_2^2} > 0.2,$$

where $C_1$ denotes the first capacitance, $C_2$ denotes the second capacitance, $C_3$ denotes the third capacitance, $n_1$ denotes the turns ratio of the first transformer T1 and $n_2$ denotes the turns ratio of the second transformer T2.

In an implementation form, the oscillator tank 309 is configured to comprise three resonance frequencies (two harmonic $\omega_{osc1}$, $\omega_{osc2}$ and one undesired $\omega_{osc3}$ oscillation frequencies). The first harmonic oscillation frequency $\omega_{osc1}$ determines a fundamental resonance frequency and the second harmonic oscillation frequency $\omega_{osc2}$ is desired to be at two times the fundamental resonance frequency. The oscillator tank 309 is configured to damp the undesired oscillation frequency $\omega_{osc3}$.

In an implementation form, the oscillator tank 309 is configured to neutralize the undesired oscillation frequency $\omega_{osc3}$ by determining the first capacitance C1 satisfying the following relation:

$$\frac{C_1}{C_1 + C_2 n_1^2 + C_3 n_1^2 n_2^2} > 0.2.$$

In an implementation form, the third capacitance C3 is predetermined or fixed and the first C1 and second C2 capacitances are configured to provide an equivalent quality factor of the oscillator tank at the fundamental resonance frequency according to the relation:

$$Q_{osc1} = \frac{(L_s C_2 + L_p C_1)}{\left(\frac{L_p C_1}{Q_p} + \frac{L_s C_2}{Q_s}\right)}.$$

$C_1$ denotes the first capacitance, $C_2$ denotes the second capacitance, $C_3$ denotes the third capacitance, $n_1$ denotes the turns ratio of the first transformers T1, $n_2$ denotes the turns ratio of the second transformer T2, $Q_{osc1}$ denotes the equivalent quality factor of the oscillator tank at the fundamental resonance frequency, $Q_p$ denotes a quality factor of primary windings of the first transformer T1, $Q_s$ denotes a quality factor of secondary windings of the first transformer T1, $L_p$ denotes an inductance of the primary windings of the first transformer T1 and $L_s$ denotes an inductance of the secondary windings of the first transformer T1.

The oscillator tank 309 is configured to provide a peak position in the oscillator tank common mode input impedance near the second harmonic of the fundamental oscillation frequency ($\omega_{osc1}$) by adjusting the ratio of the second capacitance C2 to the first capacitance C1.

In an implementation form, the transistors 301, 303 forming the negative gm stage of the oscillator 300 are PMOS transistors. In a preferred implementation form, the transistors 301, 303 forming the negative gm stage of the oscillator 300 are NMOS transistors due the following reasons. NMOS devices bring more trans-conductance gain, current and unity gain bandwidth at the same voltage level. NMOS size will be 3 times lower than PMOS for the same gm. It can thus reduce the parasitics and increase the tuning range.

The positive feedback is obtained between the drain and the gate of the gm transistors 301, 303 by using the two transformers T1 and T2. The turns ratio and the inductance value are determined by the following guidelines. The phase noise performance improves with larger voltage at intermediate node IMA, IMB and gate node GATEA, GATEB and decreasing rise and fall time of gate and drain voltage, so voltage gain between the secondary 2 and primary 1 side of the transformer T1, T2 is needed. On the other hand, largest possible combination of quality factor and inductance should be selected to achieve best phase noise performance and power consumption. The quality factor of the transformer T1, T2 dramatically drops for high turns ratio between the secondary 2 and primary 1 windings. To satisfy the trade-off between quality factor and voltage gain of the transformer, in an implementation form, 1:2 step-up transformers T1, T2 are used. The transformers T1, T2 also provide common mode rejection and impedance transformation.

Figure 4A:
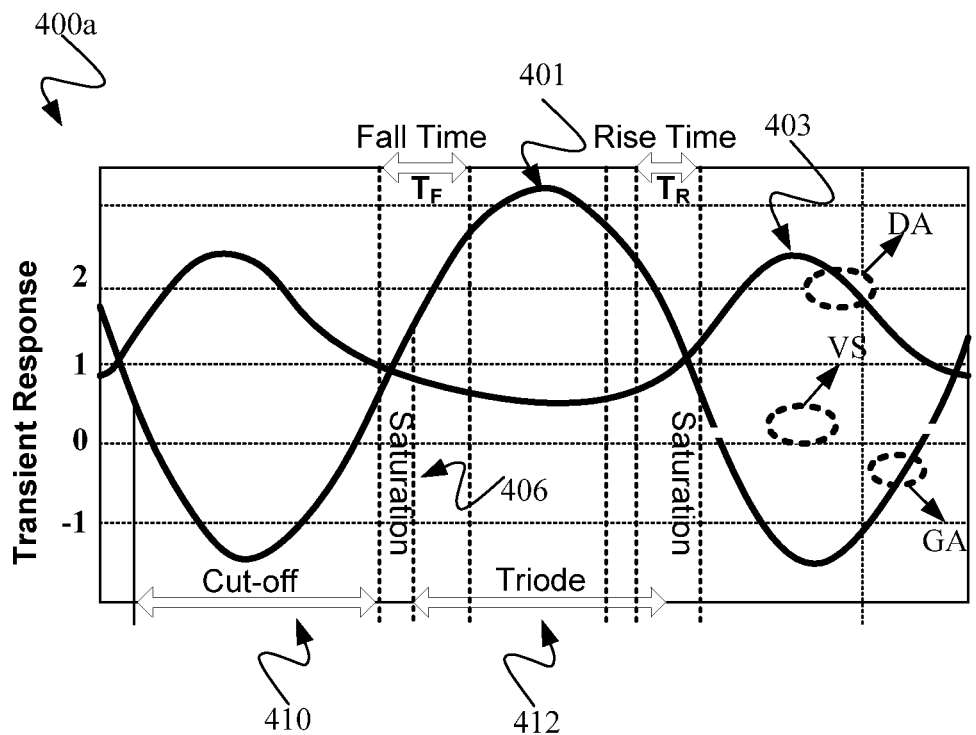
FIG. 4A shows a schematic diagram illustrating transient response 400a of gate 401 and drain 403 voltage at a transistor 301, 303 of the digitally controlled oscillator 300 as depicted in FIG. 3.
Figure 4B:
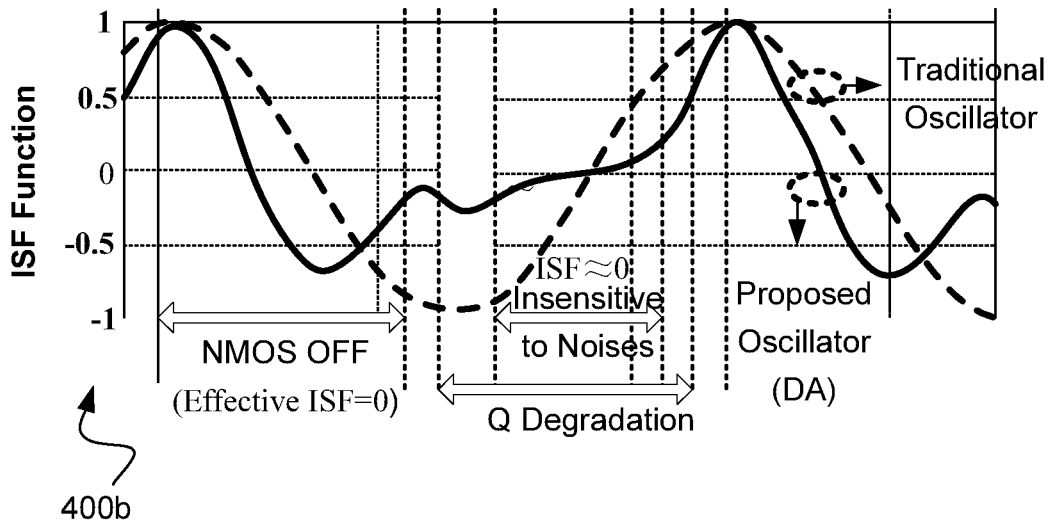
FIG. 4B shows the corresponding ISF function 400b for the transient response 400a depicted in FIG. 4A.

FIG. 4A shows a schematic diagram illustrating transient response 400a of gate 401 and drain 403 voltage at a transistor 301, 303 and FIG. 4B shows the corresponding ISF function 400b.

As signal amplitude at gate 401 increases more than a certain value, i.e., roughly the summation of overdrive voltage of tail current Itail and threshold voltage of the gm transistor 301, 303, the gm transistor 301, 303 transitions from cut-off region 410 to saturation region 406. But, the transistor 301, 303 quickly goes to triode region 412 due to large gate amplitude 401 and large tail current Itail. It causes the drain signal 403 to clip. When the oscillator tank is loaded by the gm transistors 301, 303, the on-resistance of the MOS transistors 301, 303 determine the quality factor of the oscillator tank 309. During the clipping time, the quality factor of the oscillator tank 309 is not important.

Adding a tail current Itail helps to have a faster transition between the cut-off region 410 and the triode region 412. So, as the rise and fall time of the drain voltage is decreased, it can reduce the 1/f3 phase noise corner. At the same time, it can increase the clipping or noise insensitive region and improve phase noise in a 20 dB/dec region. The bias voltage VB is responsible for adjusting the onset of clipping, changing current consumption and gate amplitude. Current consumption, gate voltage and onset edge of clipping can be controlled with adjusting tail current Itail and bias voltage VB separately.

However, near the clipping area (shaded region in FIG. 4), the gm device loads the tank and the ISF function is not zero. Thus, the degraded tank Q can dramatically affect the phase noise. Sharper gate voltage results in smaller rise and fall times (TR & TF) and alleviates this issue. The bias-voltage VB of the gm devices has a direct effect on the shaded region span. The optimum VB is the lowest possible value that satisfies the tuning range requirements, the operation at the boundary of the voltage-limited region and results in practical tail current and gm device lay-out sizes. Larger VB causes wider shaded triode region and more overlap between the active region of the gm devices, which has an adverse effect on phase noise degradation. Introducing the tail current, which was missing in original design, offers a degree of freedom to adjust the oscillator to the optimum phase noise performance.

A larger gate amplitude or a higher current are good, because they cause harder clipping, lower rise and fall time and higher charge in the tuning capacitance C1, C2, C3, thus improving the phase noise.

Solely raising the bias voltage VB of the gm transistor 301, 303 to increase the current is not productive. The low channel resistance of the gm transistor 301, 303 can degrade the quality factor of the oscillator tank 309 near the clipping area. So, it can reduce equivalent quality factor of the oscillator tank 309 and thus degrade the phase noise. This phenomenon will intensify for larger bias voltage. Therefore, the DCO design is based on the concept to increase the oscillator current with increasing the tail current bias and not through the gm transistor bias.

However, merely changing VB will not reach the optimum performance. When increasing the current consumption until the drain voltage reaches up to 2 times VDD, then, the optimum point of bias voltage VB is the lowest possible value which satisfies the oscillation condition and the specified current consumption.

The gate voltage swing, however, is too large in this structure. There is not enough control on the amplitude of the gate voltage in the process, voltage and temperature variations to avoid reliability problems. Therefore, the gate voltage is adjusted with the tail current to obtain an optimum design of the DCO circuit 300.

This DCO circuit 300 is fully differential, so, it is less sensitive to common mode noise and it has at least 20 dB more common mode rejection ratio as a original clip-and-restore DCO circuit.

The operating frequency of the oscillator 300 is determined by the input impedance of the oscillator tank 309. The oscillator tank 309 components comprise the two transformers T1, T2, fine capacitance C1 and coarse capacitance C2 and fixed capacitance C3 at the gm transistor's 301, 303 gates GATEA, GATEB. The equivalent oscillator tank circuit is shown in FIG. 5.

FIGS. 4A and 4B also illustrate the characteristic behavior of the oscillator 700 depicted in FIG. 7 and described below.

Figure 5:
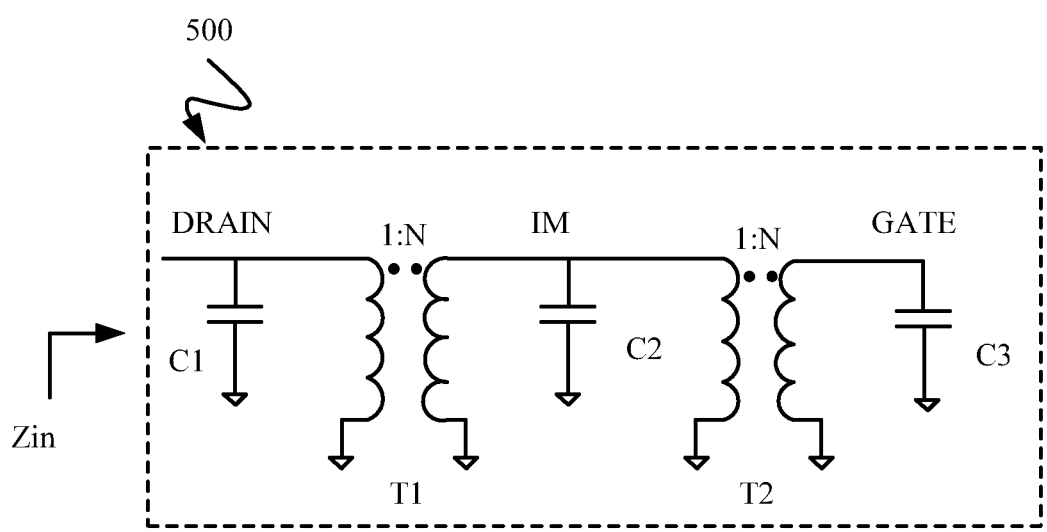
FIG. 5 shows a circuit diagram of an oscillator tank 500 according to an implementation form.

FIG. 5 shows a circuit diagram of an oscillator tank 500 according to an implementation form. The oscillator tank 500 represents a half section of the oscillator tank 309 depicted in FIG. 3. A first oscillator tank 500 and a second oscillator tank 500 are identically constructed.

The gate terminal GATE of a first half of oscillator tank 500 is connected to the gate terminal GATEA of the first transistor 301 depicted in FIG. 3, the intermediate node 1M of the first oscillator tank 500 is connected to the intermediate node IMB of the second transistor 303 depicted in FIG. 3 and the drain terminal DRAIN of the first oscillator tank 500 is connected to the drain terminal DRAINB of the second transistor 303 depicted in FIG. 3.

The gate terminal GATE of a second half of oscillator tank 500 is connected to the gate terminal GATEB of the second transistor 303 depicted in FIG. 3, the intermediate node 1M of the second oscillator tank 500 is connected to the intermediate node IMA of the first transistor 301 depicted in FIG. 3 and the drain terminal DRAIN of the second oscillator tank 500 is connected to the drain terminal DRAINA of the first transistor 301 depicted in FIG. 3. The oscillation frequency is determined by following equation:

$$\omega \approx \frac{1}{\sqrt{\left(\frac{L_{p1}L_{p2}}{n_1^2 L_{p1} + L_{p2}}\right)(C_1 + C_2 n_1^2 + C_3 n_1^2 n_2^2)}} \quad (2)$$

where $\omega$ denotes the oscillation frequency of the oscillator, $C_1$ denotes the first capacitance, $C_2$ denotes the second capacitance, $C_3$ denotes the third capacitance, $n_1$ denotes the turns ratio of the first transformer T1, $n_2$ denotes the turns ratio of the second transformer T2, $L_{p1}$ denotes a primary inductance of the first transformer T1 and $L_{p2}$ denotes a primary inductance of the second transformer T2. Equation (2) illustrates different combinations of C1, C2 and C3 resulting in the same resonance frequency. Optimum values of C1, C2 and C3 are derived in the following.

If there is perfect coupling in the two transformers T1, T2, i.e. coupling factor km=1, the voltage gain will be $n_1^2 n_2^2$ for all combinations of C1, C2, C3 at the resonance frequency, where $n_1$ denotes the turns ratio of the first transformer T1, $n_2$ denotes the turns ratio of the second transformer T2 So, the voltage gain is fixed and independent from capacitance at various nodes. But, the voltage gain will be quite different when the coupling factor is less than one. The voltage gain is a strong function of the capacitor values C1, C2, C3 from which the C3 effect is the dominant one.

Thus, it is desirable to choose a large C3, a medium C2 and a small C1 to achieve higher voltage gain. But on the other hand, C3 is a fixed capacitor for ultra-low phase noise performance and comes in to the drain by a factor of $n_1^2 n_2^2$. Using a big value for C3 can dramatically degrade the tuning range. Consequently, the required voltage gain will determine the minimum value of the C3 capacitor. In an implementation form, C3 is chosen to have 20% contribution of total equivalent capacitance at the drain node. That means, satisfying the following equation:

$$\frac{C_3 n_1^2 n_2^2}{C_1 + C_2 n_1^2 + C_3 n_1^2 n_2^2} \approx 0.3 \quad (3)$$

will satisfy the trade-off between the tuning range and the minimum voltage gain, i.e. the minimum swing at the gate.

Figure 6A:
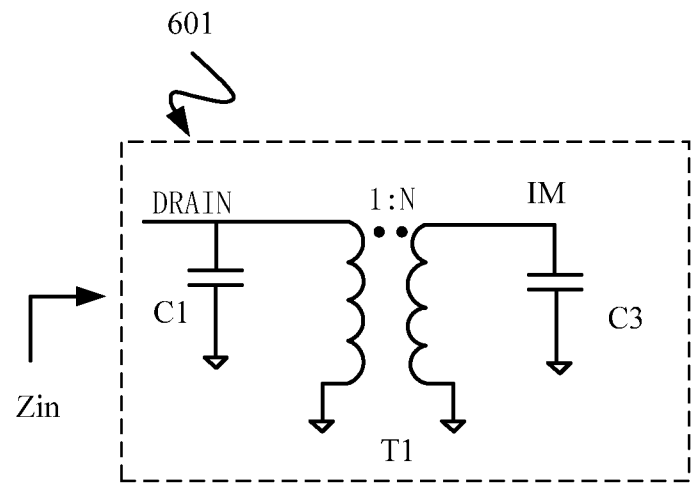
FIG. 6A shows a circuit diagram of a tuning tank 601 (transformer (first or second) with its tuning capacitances at primary or secondary windings) according to an implementation form.

FIG. 6A shows a circuit diagram of a tuning tank 601 according to an implementation form. The tuning tank 601 corresponds to the first section of the oscillator tank 500 depicted in FIG. 5 comprising the first transformer T1, the first capacitance C1 and the second capacitance C2.

Figure 6B:
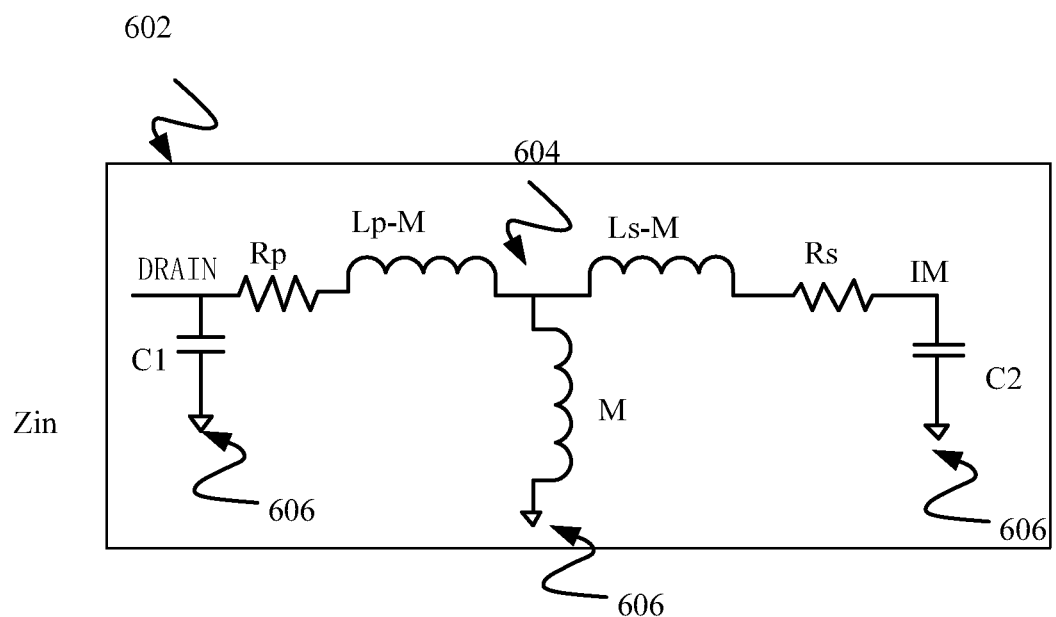
FIG. 6B shows an equivalent circuit diagram of the tuning tank 601 (transformer (first or second) with its tuning capacitances at primary or secondary windings) of FIG. 6A.

FIG. 6B shows an equivalent circuit diagram 602 of the tuning tank 601 of FIG. 6A. The primary or primary winding of the transformer T1 between drain terminal DRAIN and inner node 604 is formed by a primary resistance Rp and an primary inductance Lp-M. The secondary or secondary winding of the transformer T1 between intermediate node IM and inner node 604 is formed by a secondary resistance Rs and a secondary inductance Ls-M. From inner node 604 the inductance M is shunt to reference voltage 606, e.g. ground. From drain terminal DRAIN the first capacitance C1 is shunt to reference voltage 606, e.g. ground. From intermediate node IM the second capacitance C2 is shunt to reference voltage 606, e.g. ground.

N or n denotes the turns ratio between the secondary and primary of the transformers and C1, C2 are the tuning capacitances. The circuit has two separate poles. First pole makes fundamental and desired resonance frequency and second pole is made by imperfect coupling factor of the transformer.

The equivalent quality factor of the tuning tank 601, 602 at first resonance frequency is given by:

$$Q_{osc1} = \frac{2\left(\frac{W_{osc2}}{W_{osc1}}\right)^2 - 1}{2\left(\frac{W_{osc2}}{W_{osc1}}\right)^2} \cdot \frac{(L_s \cdot C_2 + L_p \cdot C_1)}{\frac{(L_p \cdot C_1)}{Q_p} + \frac{(L_s \cdot C_2)}{Q_s}} \quad (4)$$

Where Qp is the quality factor of primary side of the transformer T1, QS is the quality factor of secondary side of the transformer T1, Wosc1 is the fundamental resonance frequency, Wosc2 is the second resonance frequency of the tuning tank 601, 602, Lp is an inductance of the primary side of the transformer T1, Ls is a secondary inductance and C1, C2 are primary and secondary tank capacitance, respectively. Equation 4 illustrates that the position of the second resonance frequency can affect the quality factor of the desired resonance frequency and its destructive effect will be negligible if the second pole locates far away from the main pole, i.e. ωosc2/ωosc1 ≥2. This condition equals to the C2/C3 ratio which should be larger than 2 in an implementation form of the oscillator architecture.

The tuning tank 500 depicted in FIG. 5 has three different poles or resonance frequencies. The oscillator can operate at each resonance frequency if the Barkhausen criterion is satisfied. But, only the first resonance frequency is desired for the designer and any oscillations at the other frequencies will be harmful. They can distort the shape of the signal at drain. So, the clipping can disappear and the impulse sensitivity function of the oscillator will be sensitive to circuit noise and consequently, undesired oscillations degrade the phase noise performance.

The input impedance of the LC tank 500 depicted in FIG. 5 has only a real part at the resonance frequencies. Oscillation can be seen if the gm transistors exhibit enough trans-conductance gain (gm) to satisfy the Barkhausen criterion. The resonance frequencies with higher input impedance need lower gm to oscillate. Therefore, in an implementation form, the input impedance of the tank is configured to have much lower value at second and third resonances frequency compared to the fundamental resonance pole. In an implementation form, a C1/C3 ratio of more than 3 is selected to avoid undesired oscillation at other frequencies.

There are three different capacitors in the oscillator 300 depicted in FIG. 3. C3 (at gate node) is a fixed capacitor and it is used to adjust voltage gain across the tank 309, improve the frequency pushing and desensitize of oscillation frequency to parasitic gate capacitance. C2 is responsible for the coarse frequency step of the oscillator and comprises several switchable capacitors. So, C2 value changes between C2max/C2min. This ratio is somewhere between 2 and 3 for CMOS technology for an equivalent quality factor around 40 for switched capacitor. C1 is responsible for the fine frequency step. C1 value changes between C1max/C1min. This ratio is somewhere between 2 and 3 for CMOS technology for an equivalent quality factor around 40 for switched capacitor.

Dead zone area for C1, C2, and C3 values can be defined based on rules that were presented above. C3 is calculated by minimum voltage gain and tuning range according to equation (3). C1/C3 and C2/C3 ratio are determined by equations (4) and (5), respectively. Table 1 shows the recommended and forbidden choices for various tuning capacitance. The "X" area is forbidden due to undesired oscillation of the other resonance frequencies. The voltage gain of the tank drops dramatically in the "Z" region. The quality factor of the tank decreases in the "A" area due to side effect of second resonance frequency. The "O" region is optimum territory for the oscillators as presented here.

TABLE 1 recommended and forbidden choices for various tuning capacitance.

| | | C1/C3 | | | | | | | | | |
|---|---|---|---|---|---|---|---|---|---|---|---|
| | | 1 | 2 | 3 | 4 | 5 | 6 | 7 | 8 | 9 | 10 |
| C2/C3 | 1 | X | | A | A | A | A | A | A | A | A |
| | 2 | X | | | A | A | A | A | A | A | A |
| | 3 | X | | | O | O | O | O | O | A | A |
| | 4 | X | X | | O | O | O | O | O | O | O |
| | 5 | X | X | | O | O | O | O | O | O | O |
| | 6 | X | X | X | O | O | O | O | O | O | O |
| | 7 | X | X | X | O | O | O | O | O | O | O |
| | 8 | X | X | X | X | O | O | O | O | Z | Z |
| | 9 | X | X | X | X | | | | Z | Z | Z |
| | 10 | X | X | X | X | X | Z | Z | Z | Z | Z |

Figure 7:
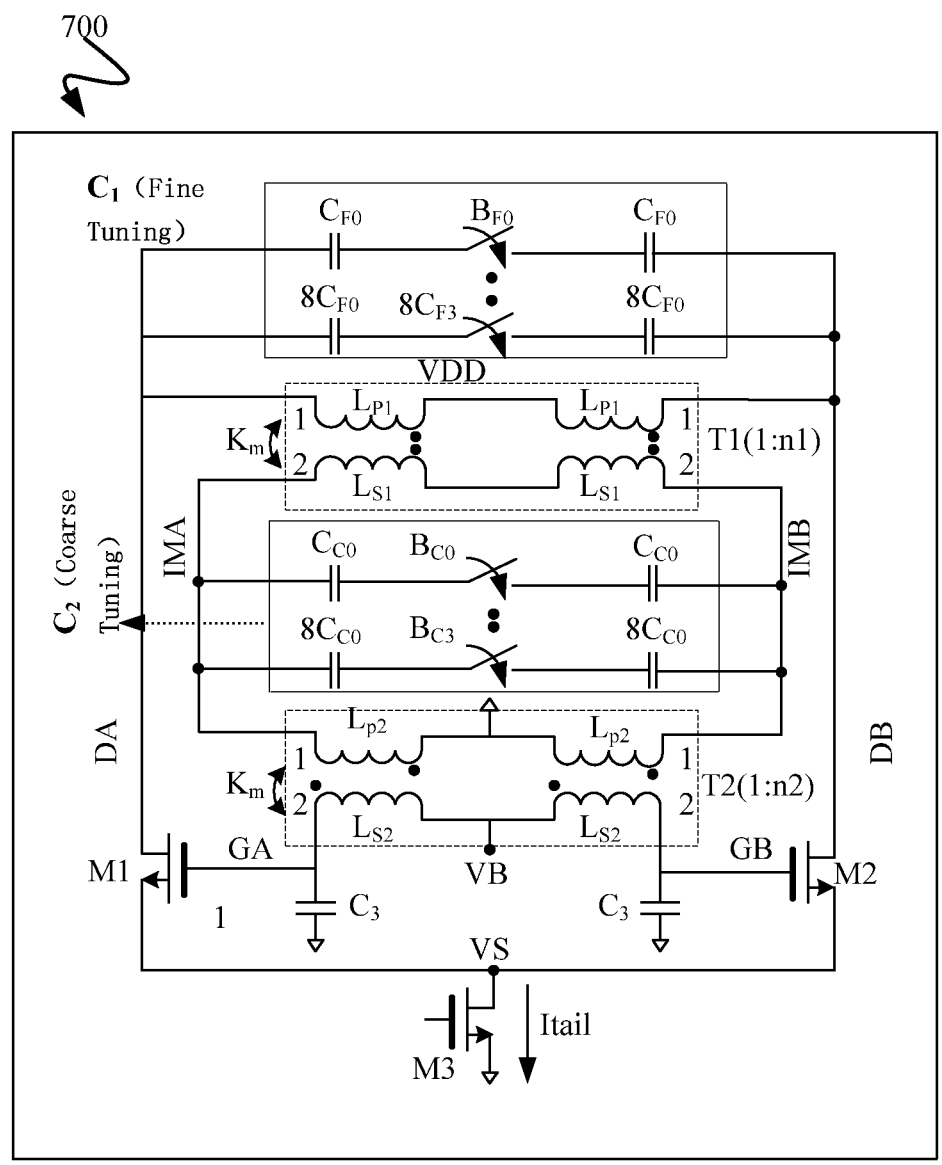
FIG. 7 shows a circuit diagram of an oscillator according to an implementation form.

FIG. 7 shows a circuit diagram of an oscillator 700 according to an implementation form. The oscillator 700 comprises a first transistor M1 and a second transistor M2 connected by their source terminals to a drain terminal VS of a third transistor M3. The third transistor M3 is forming a current source. A drain terminal DA of the first transistor M1 is connected via a first switched capacitor circuit C1 to a drain terminal DB of the second transistor M2. The drain terminal DA of the first transistor M1 is connected to a first terminal of a primary winding 1 having inductance Lp1 of a first transformer T1 and the drain terminal DB of the second transistor M2 is connected to a second terminal of the primary winding 1 of the first transformer T1. A first terminal of a secondary winding 2 having inductance Ls1 of the first transformer T1 is connected to a first terminal of a primary winding 1 having inductance Lp2 of a second transformer T2 and connected via a second switched capacitor circuit C2 to a second terminal of the second winding 2 of the first transformer T1. The second terminal of the second winding 2 of the first transformer T1 is connected to a second terminal of the primary winding 1 of the second transformer T2. A first terminal of a second winding 2 having inductance Ls2 of the second transformer T2 is connected to a gate terminal GA of the first transistor M1 and connected via a third capacitance circuit C3 to a second terminal of the secondary winding 2 of the second transformer T2. The second terminal of the secondary winding 2 of the second transformer T2 is connected to a gate terminal GB of the second transistor M2.

The switched capacitor circuit $C_1$ configured for a fine tuning comprises a plurality of parallel connected switched capacitor lines, each of the switched capacitor lines comprising different capacitance values, e.g. a first switched capacitor line comprising a first switched capacitance $C_{F0}$, a switch $B_{F0}$ and a second switched capacitance $C_{F0}$ connected in series. A fourth switched capacitor line comprising a first switched capacitance $8C_{F0}$, a switch $B_{F3}$ and a second switched capacitance $8C_{F0}$ connected in series. The switched capacitors can be configured by unit weighted or binary weighted switches and capacitances.

The switched capacitor circuit $C_2$ configured for a coarse tuning comprises a plurality of parallel connected switched capacitor lines, each of the switched capacitor lines comprising different capacitance values, e.g. a first switched capacitor line comprising a first switched capacitance $C_{C0}$, a switch $B_{C0}$ and a second switched capacitance $C_{C0}$ connected in series. A fourth switched capacitor line comprising a first switched capacitance $8C_{C0}$, a switch $B_{C3}$ and a second switched capacitance $8C_{C0}$ connected in series. The switched capacitors can be configured by unit weighted or binary weighted switches and capacitances.

The capacitor circuit C3 comprises two capacitances C3 shunt to reference voltage, e.g., ground. In an implementation form, the capacitances C3 are fixed.

Figure 8A:
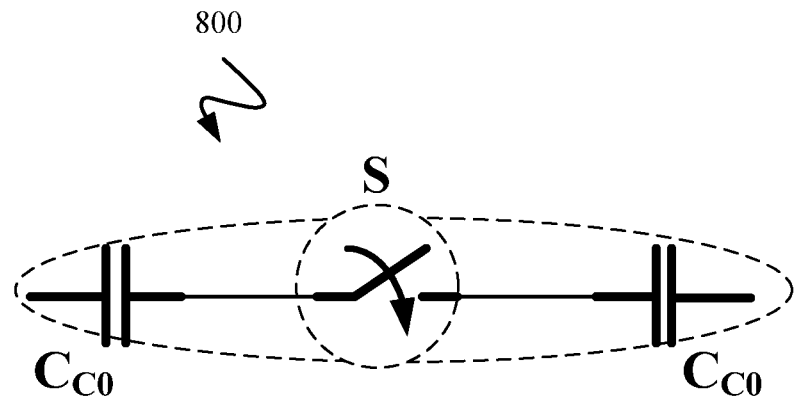
FIG. 8A shows a schematic diagram of a switched capacitor line 800 of an oscillator according to an implementation form.

FIG. 8A shows a schematic diagram of a switched capacitor line 800 of an oscillator according to an implementation form. The switched capacitor line 800 corresponds to one of the switched capacitor lines depicted in FIG. 7.

Figure 8B:
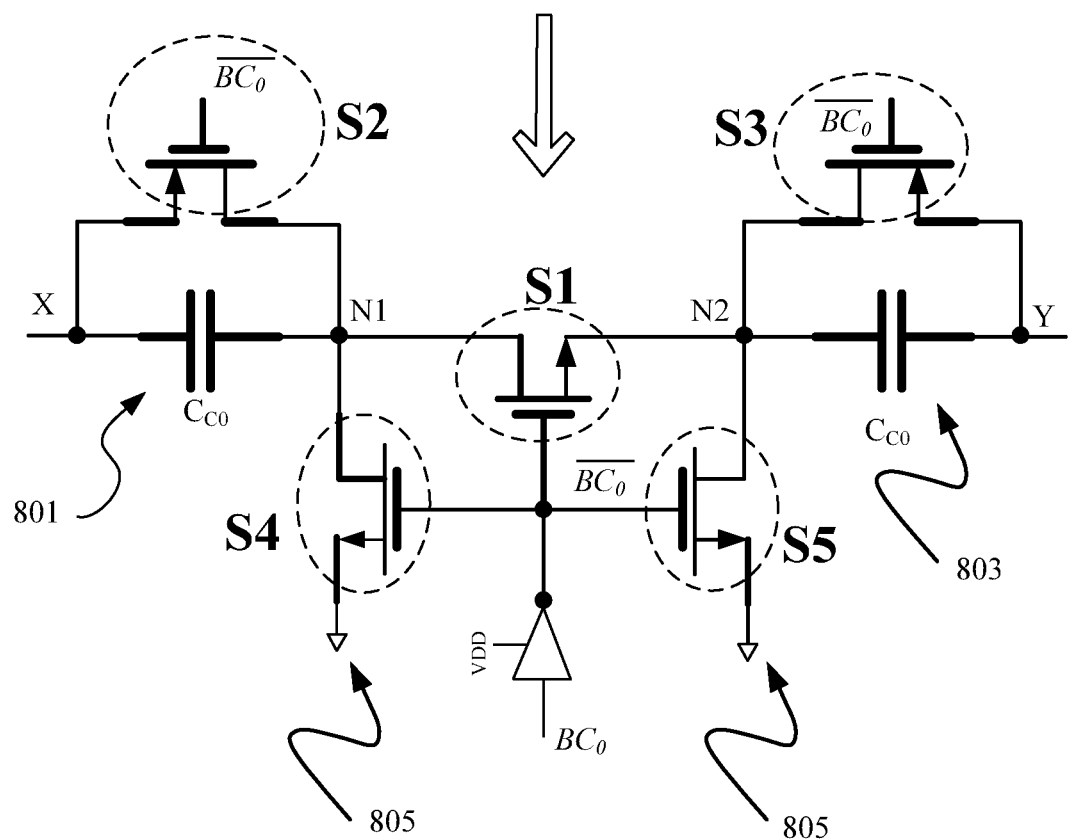
FIG. 8B shows a circuit diagram of the switched capacitor line 800 of FIG. 8A according to an implementation form.

FIG. 8B shows a circuit diagram of the switched capacitor line 800 of FIG. 8A according to an implementation form.

The switched capacitor line 800 comprises a first capacitor $C_{C0}$ 801 connected between an input terminal X and a first node N1 of the switched capacitor line 800. The switched capacitor line 800 comprises a second capacitor $C_{C0}$ 803 connected between an output terminal Y and a second node N2 of the switched capacitor line 800. The switched capacitor line 800 comprises a first switch S1 connected between the first node N1 and the second node N2 of the switched capacitor line. The switched capacitor line 800 comprises a second switch S2 connected between the input terminal X and the first node N1 of the switched capacitor line. The switched capacitor line 800 comprises a third switch S3 connected between the output terminal Y and the second node N2 of the switched capacitor line. The switched capacitor line 800 comprises a fourth switch S4 connected between the first node N1 and a reference voltage 805. The switched capacitor line 800 comprises a fifth switch S5 connected between the second node N2 and the reference voltage 805. The five switches comprise transistors which gate terminals are controlled by a common switching signal BC0.

In an implementation form, the common switching signal BC0 is connected to an inverter. The common switching signal BC0 turns off the switch when it has 0 logic mode and turns on the switch when it shows 1 logic mode. In an implementation form, the driving voltage VDD corresponds to the driving voltage VDD of the first transformer T1 of the DCO 700 depicted in FIG. 7 or of the DCO 300 depicted in FIG. 3.

Figure 9:
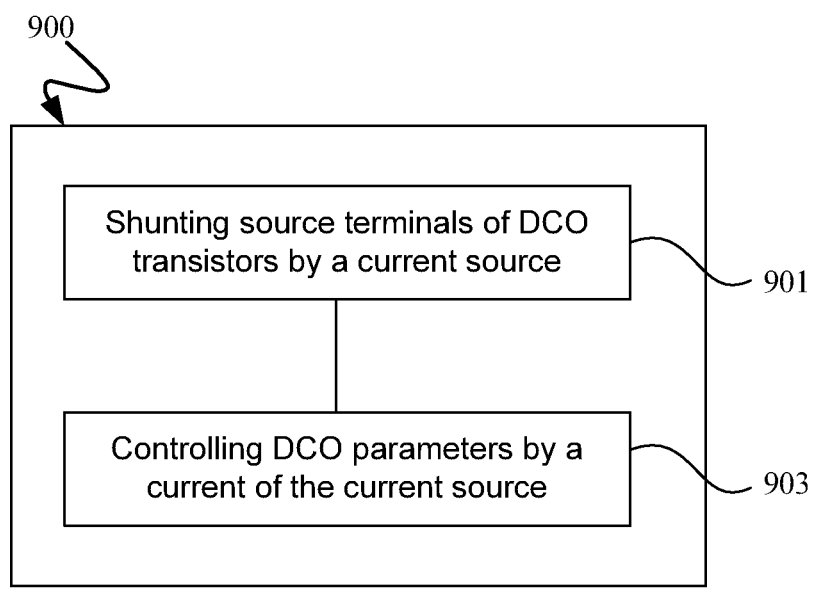
FIG. 9 shows a schematic diagram of a method 900 for operating an oscillator according to an implementation form.

FIG. 9 shows a schematic diagram of a method 900 for operating an oscillator according to an implementation form.

The method 900 is applied for operating an oscillator as described with respect to FIG. 3 or FIG. 7. The DCO comprises a pair of transistors which source terminals are interconnected and which drain and gate terminals are coupled by a positive feedback loop comprising an oscillator tank. The method 900 comprises shunting 901 the source terminals of the transistors to a reference voltage by a current source. The method 900 comprises controlling 903 physical parameters of the oscillator by a current of the current source.

From the foregoing, it will be apparent to those skilled in the art that a variety of methods, systems, computer programs on recording media, and the like, are provided.

The present disclosure also supports a computer program product including computer executable code or computer executable instructions that, when executed, causes at least one computer to execute the performing and computing steps described herein.

Many alternatives, modifications, and variations will be apparent to those skilled in the art in light of the above teachings. Of course, those skilled in the art readily recognize that there are numerous applications of the invention beyond those described herein. While the present inventions has been described with reference to one or more particular embodiments, those skilled in the art recognize that many changes may be made thereto without departing from the scope of the present invention. It is therefore to be understood that within the scope of the appended claims and their equivalents, the inventions may be practiced otherwise than as specifically described herein.

What is claimed is:

1. An oscillator, comprising:
   a pair of transistors to which a plurality of source terminals are interconnected and to which a plurality of drains and a plurality of gate terminals are coupled by a positive feedback loop comprising an oscillator tank,
   wherein the source terminals of the transistors are connected to a current source configured to control physical parameters of the oscillator,
   wherein an oscillation frequency of the oscillator is determined by an input impedance of the oscillator tank comprising step-up transformers and tuning capacitances,
   wherein a plurality of primary terminals of a first transformer are connected to drain terminals of the transistors,
   wherein a plurality of secondary terminals of the first transformer are connected to a plurality of intermediate nodes,
   wherein the intermediate nodes are common between the secondary terminals of the first transformer and the primary terminals of a second transformer,
   wherein the primary terminals of the second transformer are connected to the intermediate nodes,
   wherein the secondary terminals of the second transformer are connected to the gate terminals of the transistors, wherein a turns ratio of the first transformer is 1:$n_1$,
wherein a turns ratio of the second transformer is 1:$n_2$, and
wherein n is a positive integer.

2. The oscillator of claim 1, wherein the current source is configured to control at least one of the following physical parameters of the digitally controlled oscillator:
clipping duration at oscillation voltage around the oscillator tank;
oscillation voltage amplitude for process variations and satisfying reliability issues due to time dependent dielectric breakdown, hot carrier degradation, and drain bulk breakdown;
current consumption to adjust power consumption of the oscillator based on phase noise requirement; and
rise and fall times of the oscillation voltage around the oscillator tank.

3. The oscillator of claim 1, wherein the current source is configured to adjust current consumption and amplitude of the oscillator.

4. The oscillator of claim 1, wherein the current source comprises a metal-oxide-semiconductor field-effect transistor (MOSFET), a resistor, or a combination of a resistor and an inductor.

5. The oscillator of claim 1, wherein terminals of the step-up transformers are coupled via the capacitances that are configured according to an optimization criterion with respect to a desired oscillator tank impedance, phase noise performance, and reliability.

6. The oscillator of claim 1, wherein the primary terminals of the first transformer are coupled via a first capacitance to a reference voltage, wherein the secondary terminals of the first transformer and the primary terminals of the second transformer are coupled via a second capacitance to the reference voltage, and wherein the secondary terminals of the second transformer are coupled via a third capacitance to the reference voltage.

7. The oscillator of claim 6, wherein an oscillation frequency of the oscillator is determined according to:

$$\omega \approx \frac{1}{\sqrt{\left(\frac{L_{p1}L_{p2}}{n_1^2 L_{p1} + L_{p2}}\right)(C_1 + C_2 n_1^2 + C_3 n_1^2 n_2^2)}},$$

and
wherein $\omega$ denotes the oscillation frequency of the oscillator, $C_1$ denotes the first capacitance, $C_2$ denotes the second capacitance, $C_3$ denotes the third capacitance, $n_1$ denotes the turns ratio of the first transformer, $n_2$ denotes the turns ratio of the second transformer, $L_{p1}$ denotes a primary inductance of the first transformer, and $L_{p2}$ denotes a primary inductance of the second transformer.

8. The oscillator of claim 6, wherein the third capacitance is set to a fixed value designed for ultra-low phase noise performance of the oscillator, wherein the third capacitance satisfies the following relationship:

$$\frac{C_3 n_1^2 n_2^2}{C_1 + C_2 n_1^2 + C_3 n_1^2 n_2^2} > 0.2,$$

and
wherein $C_1$ denotes the first capacitance, $C_2$ denotes the second capacitance, $C_3$ denotes the third capacitance, $n_1$ denotes the turns ratio of the first transformer, and $n_2$ denotes the turns ratio of the second transformer.

9. The oscillator of claim 6, wherein the oscillator tank is configured to comprise two harmonic and one undesired oscillation frequencies, wherein a first harmonic oscillation frequency determines a fundamental resonance frequency, wherein a second harmonic oscillation frequency is substantially two times the fundamental resonance frequency, and wherein the oscillator tank is configured to damp the undesired oscillation frequency.

10. The oscillator of claim 9, wherein the oscillator tank is configured to neutralize the undesired oscillation frequency by determining the first capacitance satisfying the following relation:

$$\frac{C_1}{C_1 + C_2 n_1^2 + C_3 n_1^2 n_2^2} > 0.2;$$

and
wherein the third capacitance is predetermined and the first and second capacitances are configured to provide an equivalent quality factor of the oscillator tank at the fundamental resonance frequency according to the relation:

$$Q_{osc1} = \frac{(L_s C_2 + L_p C_1)}{\left(\frac{L_p C_1}{Q_p} + \frac{L_s C_2}{Q_s}\right)},$$

where $C_1$ denotes the first capacitance, $C_2$ denotes the second capacitance, $C_3$ denotes the third capacitance, $n_1$ denotes the turns ratio of the first transformers, $n_2$ denotes the turns ratio of the second transformer, $Q_{osc1}$ denotes the equivalent quality factor of the oscillator tank at the fundamental resonance frequency, $Q_p$ denotes a quality factor of primary windings of the first transformer, $Q_s$ denotes a quality factor of secondary windings of the first transformer, $L_p$ denotes an inductance of the primary windings of the first transformer and $L_s$ denotes an inductance of the secondary windings of the first transformer.

11. The oscillator of claim 9, either wherein the oscillator tank is configured to neutralize the undesired oscillation frequency by determining the first capacitance satisfying the following relation:

$$\frac{C_1}{C_1 + C_2 n_1^2 + C_3 n_1^2 n_2^2} > 0.2;$$

or
wherein the third capacitance is predetermined and the first and second capacitances are configured to provide an equivalent quality factor of the oscillator tank at the fundamental resonance frequency according to the relation:

$$Q_{osc1} = \frac{(L_s C_2 + L_p C_1)}{\left(\frac{L_p C_1}{Q_p} + \frac{L_s C_2}{Q_s}\right)},$$

where $C_1$ denotes the first capacitance, $C_2$ denotes the second capacitance, $C_3$ denotes the third capacitance, $n_1$ denotes the turns ratio of the first transformers, $n_2$ denotes the turns ratio of the second transformer, $Q_{osc1}$ denotes the equivalent quality factor of the oscillator tank at the fundamental resonance frequency, $Q_p$ denotes a quality factor of primary windings of the first transformer, $Q_s$ denotes a quality factor of secondary windings of the first transformer, $L_p$ denotes an inductance of the primary windings of the first transformer and $L_s$ denotes an inductance of the secondary windings of the first transformer.

12. The oscillator of claim 6, wherein the oscillator tank is configured to provide a peak position in the oscillator tank common mode input impedance near the second harmonic of the fundamental oscillation frequency by adjusting the ratio of the second capacitance to the first capacitance.

* * * * *